US010153291B1

(12) United States Patent
DeForge et al.

(10) Patent No.: US 10,153,291 B1
(45) Date of Patent: *Dec. 11, 2018

(54) LATERAL NON-VOLATILE STORAGE CELL

(71) Applicant: International Business Machines Corporation, Armonk, NY (US)

(72) Inventors: John B. DeForge, Barre, VT (US); John J. Ellis-Monaghan, Grand Isle, VT (US); Terence B. Hook, Jericho, VT (US); Kirk D. Peterson, Jericho, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/807,666

(22) Filed: Nov. 9, 2017

Related U.S. Application Data

(63) Continuation of application No. 15/618,695, filed on Jun. 9, 2017.

(51) Int. Cl.
| | | |
|---|---|---|
| *H01L 27/115* | (2017.01) | |
| *H01L 27/1156* | (2017.01) | |
| *H01L 27/12* | (2006.01) | |
| *H01L 27/11558* | (2017.01) | |

(52) U.S. Cl.
CPC .... *H01L 27/1156* (2013.01); *H01L 27/11558* (2013.01); *H01L 27/1211* (2013.01)

(58) Field of Classification Search
CPC ................ H01L 27/1156; H01L 27/1211
See application file for complete search history.

(56) References Cited

U.S. PATENT DOCUMENTS

| | | | | | |
|---|---|---|---|---|---|
| 5,239,505 | A | * | 8/1993 | Fazio | G11C 16/28 365/185.02 |
| 5,482,879 | A | * | 1/1996 | Hong | H01L 29/66825 257/316 |
| 5,501,996 | A | * | 3/1996 | Yang | H01L 27/11521 148/DIG. 168 |

(Continued)

OTHER PUBLICATIONS

List of IBM Patents or Patent Applications Treated as Related; (Appendix P), Filed Nov. 9, 2017; 2 pages.
John B. DeForge et al., "Lateral Non-Volatile Storage Cell", U.S. Appl. No. 15/618,695, filed Jun. 9, 2017.

*Primary Examiner* — Eric Ward
(74) *Attorney, Agent, or Firm* — Cantor Colburn LLP; Steven Meyers

(57) ABSTRACT

A method fabricates a lateral non-volatile storage cell. The lateral non-volatile storage cell includes a first transistor including a first transistor body formed on a dielectric layer. The first transistor includes a source region and drain region on opposite sides of the first transistor body. A second transistor is laterally adjacent to the first transistor and includes a second transistor body, parallel with the first transistor body, formed on the dielectric layer. A first layer of gate oxide of a first thickness is formed over the first transistor body, and a second layer of gate oxide of a second thickness is formed over a portion of the second transistor body. The first thickness and the second thickness are different. A floating gate is formed over the first layer of gate oxide, the second layer of gate oxide, and the dielectric layer.

6 Claims, 5 Drawing Sheets

(56) References Cited

U.S. PATENT DOCUMENTS

| | | | |
|---|---|---|---|
| 6,207,989 B1* | 3/2001 | Li | H01L 27/115 257/314 |
| 6,225,660 B1* | 5/2001 | Liu | H01L 27/11521 257/316 |
| 6,407,442 B2* | 6/2002 | Inoue | H01L 27/1203 257/347 |
| 6,457,108 B1* | 9/2002 | Hsu | G11C 7/20 257/E21.209 |
| 7,217,621 B2* | 5/2007 | Chen | G11C 16/0483 257/320 |
| 7,417,279 B2* | 8/2008 | Chao | H01L 27/115 257/314 |
| 7,539,059 B2* | 5/2009 | Lee | G11C 16/26 365/185.03 |
| 7,700,993 B2* | 4/2010 | Cai | G11C 16/0433 257/313 |
| 7,893,483 B2* | 2/2011 | Kinoshita | H01L 21/28273 257/319 |
| 8,299,519 B2* | 10/2012 | Chou | H01L 21/84 257/315 |
| 8,716,803 B2* | 5/2014 | Wang | H01L 27/1156 257/192 |
| 8,878,280 B2* | 11/2014 | Zhu | H01L 21/845 257/316 |
| 8,921,916 B2* | 12/2014 | Huang | H01L 29/7883 257/318 |
| 9,337,352 B1* | 5/2016 | Gu | H01L 29/7887 |
| 9,361,986 B2* | 6/2016 | Chen | G11C 5/063 |
| 2006/0022255 A1* | 2/2006 | Yao | H01L 27/112 257/315 |
| 2006/0237803 A1* | 10/2006 | Zhu | H01L 21/28097 257/410 |
| 2007/0241387 A1* | 10/2007 | Onoda | H01L 21/84 257/314 |
| 2008/0296651 A1* | 12/2008 | Yoshida | H01L 27/115 257/315 |
| 2011/0101440 A1* | 5/2011 | Cai | H01L 21/823425 257/319 |

* cited by examiner

LATERAL NON-VOLATILE STORAGE CELL

DOMESTIC PRIORITY

This application is a continuation of U.S. application Ser. No. 15/618,695 filed Jun. 9, 2017, the disclosure of which is incorporated herein by reference in its entirety.

BACKGROUND

The present invention relates to non-volatile random-access memory (NVRAM), and more specifically, to a lateral non-volatile storage cell.

Unlike volatile random-access memory such as a dynamic RAM (DRAM), an NVRAM storage cell retains the stored information when power is turned off. Each bit of data is written to a separate storage cell within an integrated circuit or chip, and an array of the storage cells makes up a memory device. The storage cells can be integrated on the same die or multi-chip module of an application-specific integrated circuit (ASIC) or microprocessor in an embedded configuration. Because power is not continually applied to an NVRAM storage cell, the duration of retention of the stored value without power applied is an important factor in the accuracy of the storage cell.

SUMMARY

According to an embodiment of the present invention, a lateral non-volatile storage cell includes a first transistor including a first transistor body formed on a dielectric layer. The first transistor includes a source region and drain region on opposite sides of the first transistor body. A second transistor is laterally adjacent to the first transistor and includes a second transistor body, parallel with the first transistor body, formed on the dielectric layer. The lateral non-volatile storage cell includes a first layer of gate oxide of a first thickness formed over the first transistor body and a second layer of gate oxide of a second thickness formed over a portion of the second transistor body. The first thickness and the second thickness are different. A floating gate is formed over the first layer of gate oxide, the second layer of gate oxide, and the dielectric layer.

According to another embodiment of the invention, a lateral non-volatile storage cell includes a first transistor including a first transistor body formed on a dielectric layer. The first transistor includes a source region and drain region on opposite sides of the first transistor body. A second transistor is laterally adjacent to the first transistor and includes a second transistor body, parallel with the first transistor body, formed on the dielectric layer. A first layer of gate oxide of a first thickness is formed over the first transistor body. A second layer of gate oxide of a second thickness is formed over a portion of the second transistor body. The first thickness and the second thickness are different. A floating gate formed over the first layer of gate oxide, the second layer of gate oxide, and the dielectric layer.

According to yet another embodiment of the invention, a memory device includes an array of lateral non-volatile storage cells. Each of the lateral non-volatile storage cells includes a first transistor including a first transistor body formed on a dielectric layer. The first transistor includes a source region and drain region on opposite sides of the first transistor body. A second transistor is laterally adjacent to the first transistor and includes a second transistor body, parallel with the first transistor body, formed on the dielec-tric layer. A first layer of gate oxide of a first thickness is formed over the first transistor body, and a second layer of gate oxide of a second thickness is formed over a portion of the second transistor body, wherein the first thickness and the second thickness are different. A floating gate formed over the first layer of gate oxide, the second layer of gate oxide, and the dielectric layer. The memory device also includes source lines and bit lines formed perpendicular to word lines. The first transistor of each of the lateral non-volatile storage cells is connected to one of the source lines and one of the bit lines and the second transistor of each of the lateral non-volatile storage cells is connected to one of the word lines.

Additional features are realized through the techniques of the present invention. Other embodiments and aspects of the invention are described in detail herein and are considered a part of the claimed invention. For a better understanding of the invention with the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated.

DETAILED DESCRIPTION

As previously noted, non-volatile memory retains a stored value even when power is no longer applied to the storage cell. The structure of the storage cell can affect the duration for which the stored value is retained with the applied power. Embodiments of the systems and methods detailed herein relate to a lateral non-volatile storage cell. The lateral non-volatile storage cell according to embodiments of the invention includes two independent transistors that are arranged laterally and share a floating gate. The floating gate refers to the fact that the gate that wraps around the fins, in the case of a fin device for example, is not in direct contact with the silicon substrate below, but is entirely insulated by a dielectric. The floating gate charge represents the stored value. The structure including the floating gate, according to embodiments of the invention, increases the duration that a charge is retained in comparison to conventional structures by eliminating the connection of the gate to the silicon substrate and, thereby, the leak of charge to the silicon substrate.

Figure 1:
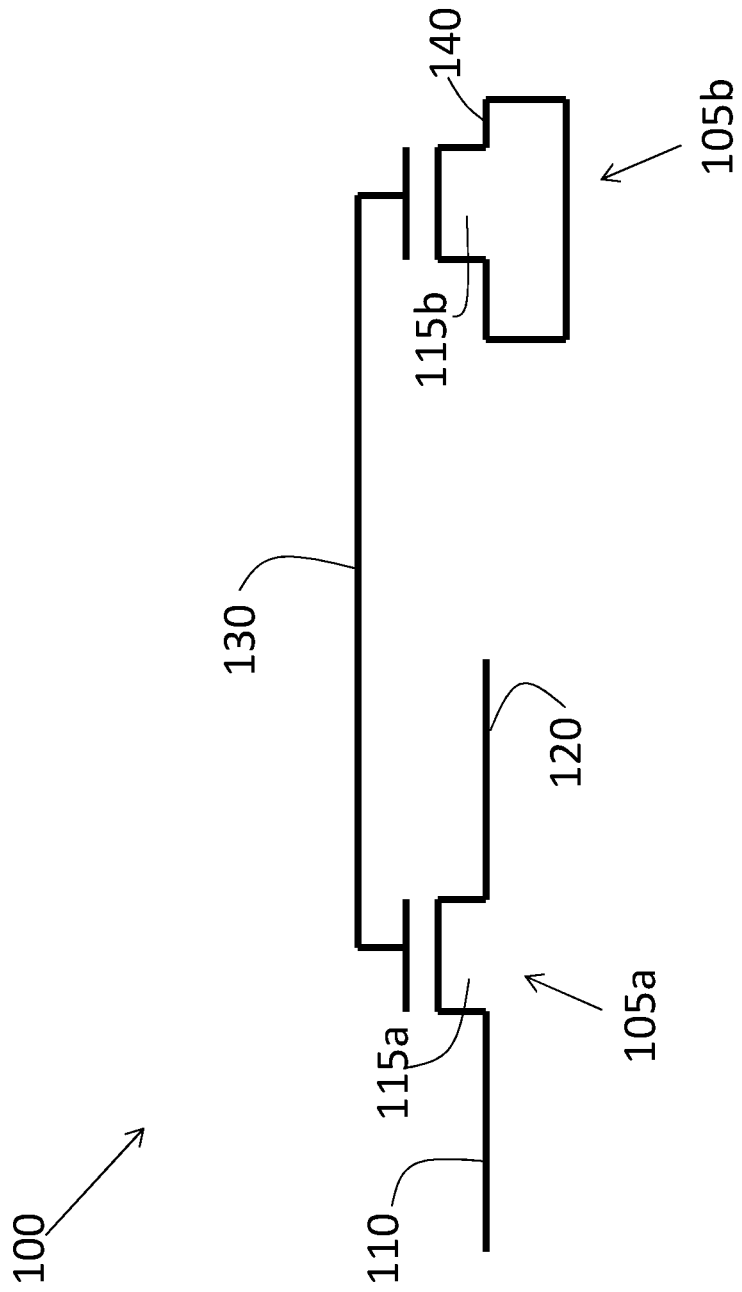
FIG. 1 shows a lateral non-volatile storage cell according to one or more embodiments of the invention.

With reference now to FIG. 1, a lateral non-volatile storage cell 100 is shown according to one or more embodiments of the invention. The lateral non-volatile storage cell 100 includes transistors 105a, 105b that are arranged laterally rather than stacked. The first transistor 105a includes a source region 110 and a drain region 120 on either side of a transistor body 115a. The second transistor 105b includes a transistor body 115b and a shorted or connected source and drain 140 such that the transistor 105b acts as a capacitor. The transistors 105a, 105b share a floating gate 130. The transistor 105a facilitates tunneling of charge to the floating gate 130 in order to store the charge on the floating gate 130, while the transistor 105b acts as a barrier to prevent charge on the floating gate 130 from leaking. The way that the function of the transistor 105a as a tunnel and the function of the transistor 105b as a barrier are achieved is detailed with reference to FIG. 2.

Figure 2:
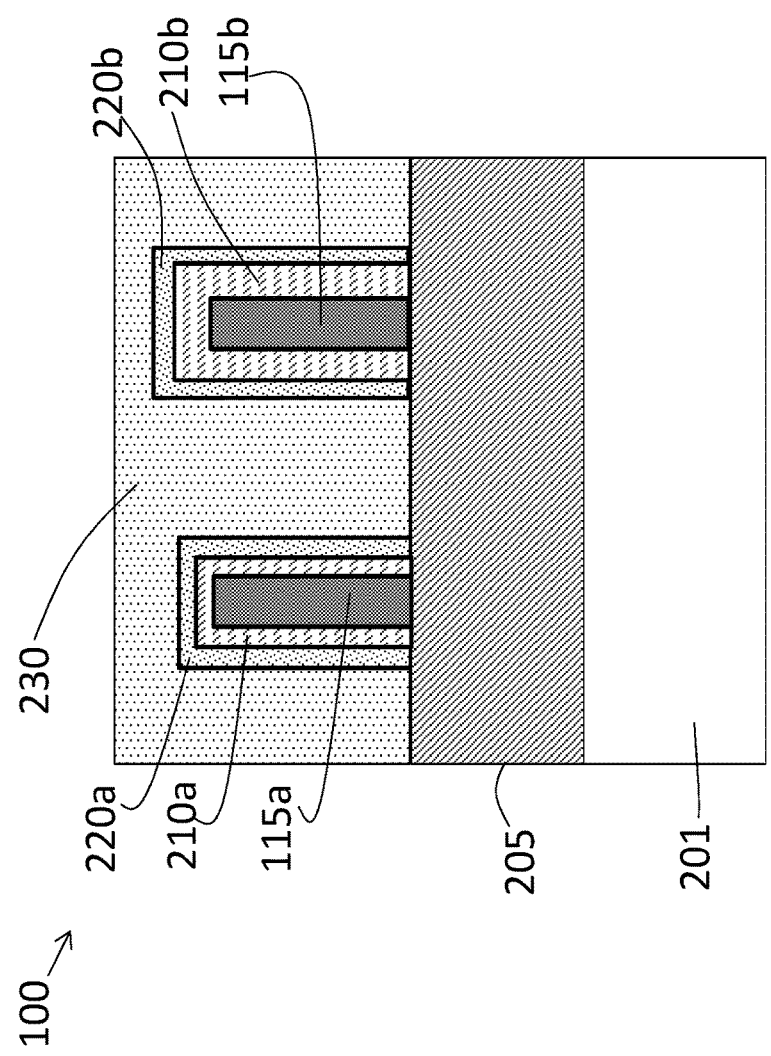
FIG. 2 is a cross-sectional view of a block diagram of a lateral non-volatile storage cell according to one or more embodiments of the invention.

FIG. 2 is a cross-sectional view of a lateral non-volatile storage cell 100 according to one or more embodiments of the invention. The cross-section shown in FIG. 2 is across the transistor bodies 115a, 115b. A dielectric layer 205 is formed on a substrate 201. For example, the dielectric layer 205 is an oxide (e.g., silicon dioxide ($SiO_2$)), and the substrate 201 is silicon (Si). The fins 115a, 115b are formed on the dielectric layer 205. An interlayer dielectric (ILD) 210a, 210b (collectively referred to as 210) is respectively formed on each of the fins 115a, 115b in a conformal manner. The ILD 210 can be the same material as the dielectric layer 205 (e.g., $SiO_2$). A high k dielectric 220a, 220b (collectively referred to as 220) is respectively formed on the ILD 210a, 210b in a conformal manner. The high k dielectric 220 can be Hafnium oxide (HfO2), for example. The ILD 210 and the high k dielectric 220 are different materials and together form the gate oxide layer.

As FIG. 2 indicates, two high k dielectric layers 220a, 220b are the same thickness, but the ILD 210b that is formed on fin 115b is thicker than the ILD 210a that is formed on the fin 115a. This difference in thickness allows the transistor body 115a, which has a thinner layer of ILD 210a formed over it, to act as a tunnel to move charge to the floating gate 130 while the transistor body 115b, which has a thicker layer of ILD 210b formed over it, to act as a barrier to charge leaving the floating gate 230. The gate oxide thickness (thickness of the ILD 210a and high k dielectric 220a) over transistor body 115a can be on the order of 1.2 nanometers while the gate oxide thickness (thickness of the ILD 210b and high k dielectric 220b) over transistor body 115b can be on the order of 3 nanometers. The exemplary thicknesses refer to the effective electrical thicknesses. Based on the differing thicknesses, a higher voltage is required to tunnel through the dielectric (ILD 210b) on transistor body 115b than through the dielectric (ILD 210a) on transistor body 115a.

Figure 3:
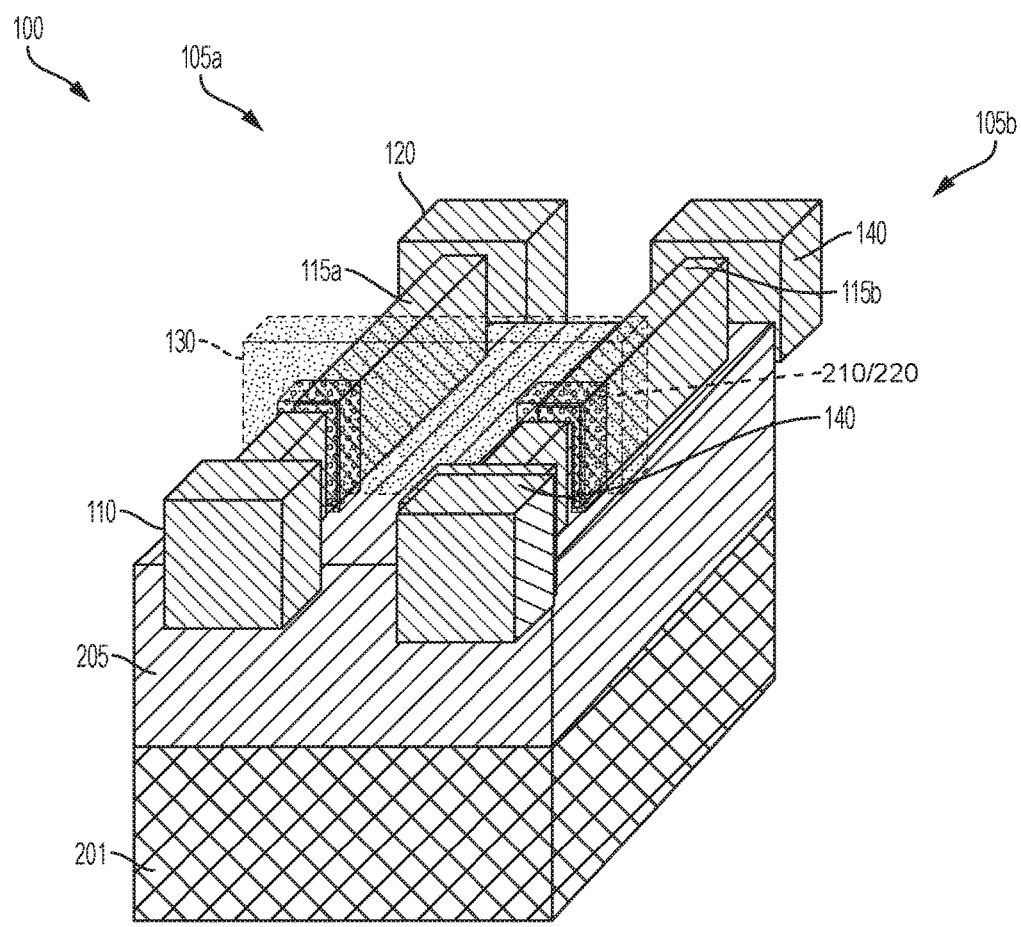
FIG. 3 is a three-dimensional view of an exemplary embodiment of a lateral non-volatile storage cell.

FIG. 3 is a three-dimensional view of an exemplary embodiment of a lateral non-volatile storage cell 100. According to the embodiment shown in FIG. 3, the transistors 105a, 105b are silicon-on-insulator (SOI) fin field effect transistors (finFETs). FIG. 3 does not show the external connection to create the connected source and drain 140. In alternate embodiments, the lateral non-volatile storage cell 100 can be formed using bulk finFETs, planar partially depleted SOI (PDSOI), planar bulk, or planar fully depleted SOI (FDSOI) devices. Further, the width and number of fins in each of the transistors 105a, 105b need not be the same, as shown for the exemplary SOI finFETS in FIG. 3 (and in FIG. 2).

Fabrication of the lateral non-volatile storage cell 100 according to each of the different architectures is according to known processes. A distinguishing feature of the lateral non-volatile storage cell 100 according to one or more embodiments involves the different thickness of the ILD 210 on one transistor body 115 in relation to the other. This difference in thickness facilitates one of the transistors 105 acting as a tunnel for the charge to the floating gate 130 while the other transistor 105 acts as a barrier for a charge from the floating gate 130. Retention of the charge on the floating gate 130 and, consequently, retention of the stored value by the lateral non-volatile storage cell 100 is enhanced based on the function of one transistor 105 as a tunnel and the other transistor 105 as a barrier.

Figure 4:
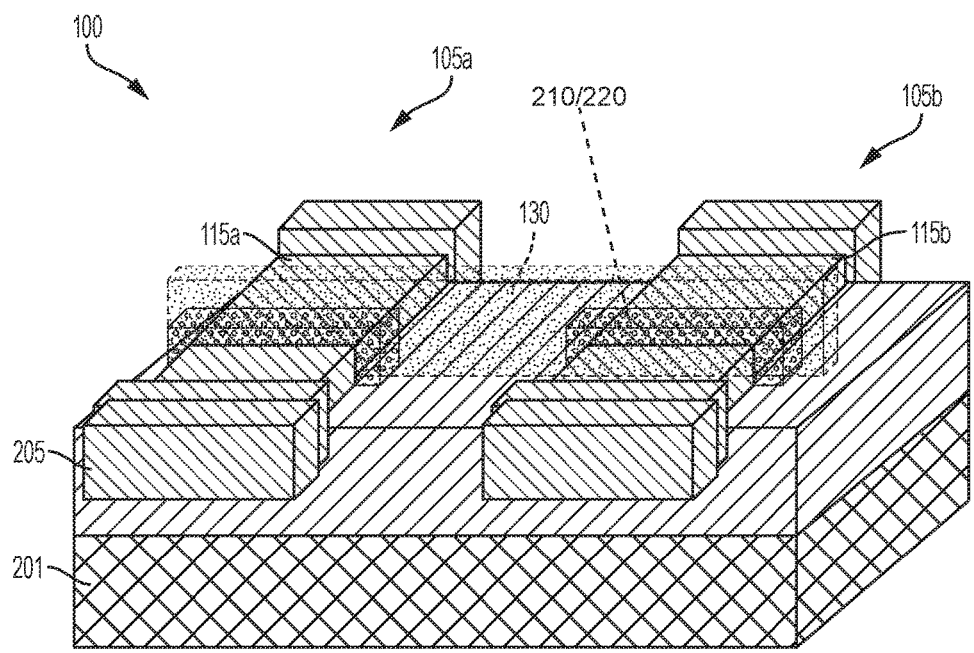
FIG. 4 is a three-dimensional view of another exemplary embodiment of a lateral non-volatile storage cell.

FIG. 4 shows an exemplary embodiment of a lateral non-volatile storage cell 100 with an FDSOI architecture. In the embodiment with an FDSOI architecture, the transistor bodies 115a and 115b are not fins. A cross-sectional view through the floating gate 130 and the transistor bodies 115a, 115b would look like FIG. 2. That is, although the transistor bodies 115a, 115b are not fins according to the embodiment shown in FIG. 4, a gate oxide that includes an ILD 210 and high k dielectric 220 is conformally formed between each of the transistor bodies 115a, 115b and the floating gate 130. Further, a thicker layer of ILD 210 is formed around one of the transistor bodies 115a, 115b as compared with the other, as shown in FIG. 2.

Figure 5:
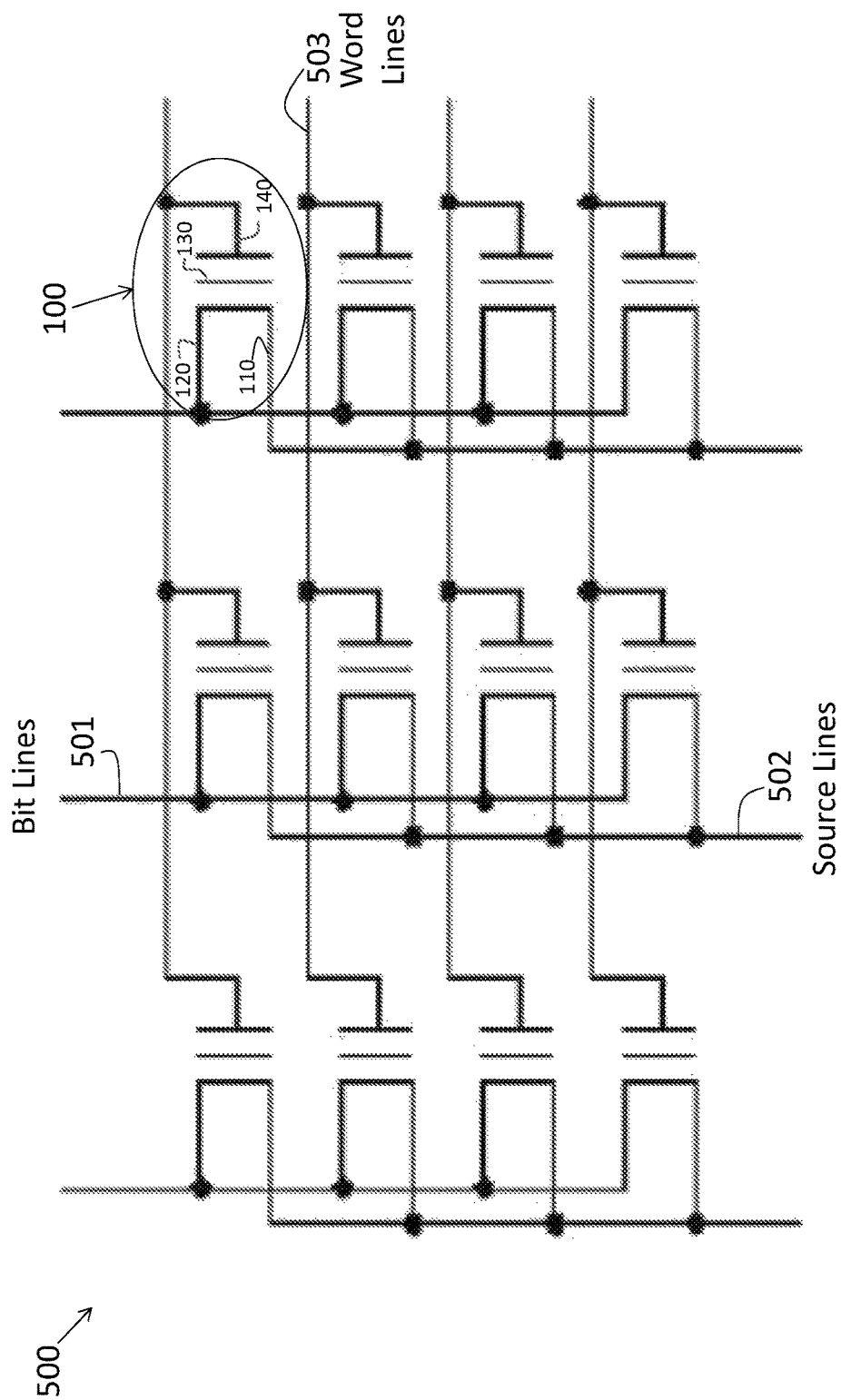
FIG. 5 is a memory device that includes an array of memory cells according to embodiments of the invention.

FIG. 5 is a memory device 500 that includes an array of lateral non-volatile storage cells 100 according to embodiments of the invention. Bit lines 501 connect to the drain region 120 of each transistor 105a, source lines 502 connect to the source region 110 of each transistor 105a, and word lines 503 connect to the shorted or connected source and drain 140 of each transistor 105b. The read and write operation for the memory device 500 is compatible with standard logic, because the word lines 503 are orthogonal to the bit lines 501. As a result, the lateral non-volatile storage cells 100 can be fabricated in an embedded device in addition to being fabricated as stand-alone cells. By choosing a particular word line 503 and corresponding source line 502 and bit line 501 to address a particular lateral non-volatile storage cell 100.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment of the invention had been described, it will be understood that those skilled in the art, both now and in the future, may make various improvements and enhancements which fall within the scope of the claims which follow. These claims should be construed to maintain the proper protection for the invention first described.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of fabricating a lateral non-volatile storage cell, the method comprising:

fabricating a first transistor including a first transistor body formed on a dielectric layer, wherein the first transistor includes a source region and drain region on opposite sides of the first transistor body;

fabricating a second transistor laterally adjacent to the first transistor and including a second transistor body, parallel with the first transistor body, formed on the dielectric layer;

forming a first layer of gate oxide of a first thickness over a portion of the first transistor body;

forming a second layer of gate oxide of a second thickness over a portion of the second transistor body, wherein the first thickness and the second thickness are different; and forming a floating gate over the first layer of gate oxide, the second layer of gate oxide, and the dielectric layer, wherein each of the forming the first layer of gate oxide and the forming the second layer of gate oxide includes depositing an interlayer dielectric (ILD) and a high k dielectric, the depositing the high k dielectric of the first layer of gate oxide is at a same thickness as the depositing the high k dielectric of the second layer of gate oxide, and the depositing the ILD of the first layer of gate oxide is at a different thickness than the depositing the ILD of the second layer of gate oxide.

2. The method according to claim 1, wherein the forming the first layer of gate oxide is as a conformal layer over the first transistor body and the forming the second layer of gate oxide is as a conformal layer over the second transistor body.

3. The method according to claim 1, wherein the depositing the ILD includes depositing silicon dioxide ($SiO_2$) and the depositing the high k dielectric includes depositing hafnium oxide ($HfO_2$).

4. The method according to claim 1, wherein the fabricating the first transistor and the fabricating the second transistor includes fabricating fin field effect transistors.

5. The method according to claim 1, further comprising connecting the first transistor to a source line and a bit line and connecting the second transistor to a word line.

6. The method according to claim 1, wherein the depositing the ILD includes depositing a different material than a material of the dielectric layer.

* * * * *